(12) United States Patent
Sieg

(10) Patent No.: US 9,593,932 B2
(45) Date of Patent: Mar. 14, 2017

(54) CAPACITIVE SENSOR DEVICE WITH ASSOCIATED EVALUATION CIRCUIT

(71) Applicant: HUF HÜLSBECK & FÜRST GMBH & CO. KG, Velbert (DE)

(72) Inventor: Berthold Sieg, Bottrop (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 35 days.

(21) Appl. No.: 14/650,790

(22) PCT Filed: Nov. 22, 2013

(86) PCT No.: PCT/EP2013/074448
§ 371 (c)(1),
(2) Date: Jun. 9, 2015

(87) PCT Pub. No.: WO2014/095223
PCT Pub. Date: Jun. 26, 2014

(65) Prior Publication Data
US 2015/0330768 A1    Nov. 19, 2015

(30) Foreign Application Priority Data

Dec. 18, 2012    (DE) .......................... 10 2012 112 479

(51) Int. Cl.
*G01R 27/26*    (2006.01)
*G01B 7/14*    (2006.01)
(Continued)

(52) U.S. Cl.
CPC ................ *G01B 7/14* (2013.01); *E05F 15/73* (2015.01); *G01V 3/088* (2013.01); *G01V 13/00* (2013.01);
(Continued)

(58) Field of Classification Search
CPC  G01R 27/2605; G01R 31/028; G01R 31/024; G01R 15/00; G01R 27/2611;
(Continued)

(56) References Cited

U.S. PATENT DOCUMENTS 8,154,310 B1 *   4/2012   Maharyta .............. G06F 3/0416
324/678

FOREIGN PATENT DOCUMENTS

DE          19617038 A1     11/1997
DE          19620059 A1     11/1997
(Continued)

OTHER PUBLICATIONS

International Search Report of International Application No. PCT/EP2013/074448 dated Feb. 12, 2014, 4 pages.

*Primary Examiner* — Alesa Allgood
(74) *Attorney, Agent, or Firm* — Fay Sharpe LLP

(57) ABSTRACT

A capacitive sensor device includes a sensor electrode coupled to a first switch and coupleable either to a sensor operating voltage or to an evaluation circuit, configured as a power source circuit. A first current path is coupleable to the sensor electrode at an input end and to ground via a collector and emitter of a first transistor by an auxiliary resistor. A second current path is coupled to a reference potential at one end. A capacitor is coupled between the reference potential and a second transistor. A second auxiliary resistor is arranged in the second current path. The first transistor's base and collector are coupled to the base of the second transistor. A compensation capacitor has a first terminal coupled to the first current path and a second terminal coupleable to a compensation voltage, to ground, or in a floating manner via a second switch.

1 Claim, 3 Drawing Sheets

(51) Int. Cl.
*G01V 13/00* (2006.01)
*G01V 3/08* (2006.01)
*E05F 15/73* (2015.01)
*H03K 17/955* (2006.01)
*H03K 17/96* (2006.01)

(52) U.S. Cl.
CPC ......... *H03K 17/955* (2013.01); *H03K 17/962* (2013.01); *E05Y 2900/50* (2013.01); *H03K 2217/9401* (2013.01); *H03K 2217/960705* (2013.01); *H03K 2217/960725* (2013.01)

(58) Field of Classification Search
CPC ...... G06F 3/0416; G06F 3/044; G06F 3/0412; G06F 2203/04101; G06F 2203/04104; G06F 2203/04106; H03K 17/955; H03K 17/962; H03K 2217/960725; Y02B 20/346; Y10T 307/344
USPC ........ 324/658, 678, 686, 382, 548; 320/166; 345/174
See application file for complete search history.

(56) References Cited

FOREIGN PATENT DOCUMENTS

| EP | 1505734 | A2 | 2/2005 | |
|---|---|---|---|---|
| WO | WO 2010/045662 | A2 | 4/2010 | |
| ZA | WO 2010045662 | * | 4/2010 | ........... H03K 17/955 |

\* cited by examiner

CAPACITIVE SENSOR DEVICE WITH ASSOCIATED EVALUATION CIRCUIT

BACKGROUND

The invention relates to a capacitive sensor device for detecting capacitance changes at a proximity sensor. When an object or body approaches a sensor electrode, the capacitive sensor device according to the invention and the associated evaluation circuit detect a change in the capacitance at the sensor electrode.

Capacitive proximity switches are known in the prior art in the field of application for vehicles. By way of example, EP 1505734 discloses a capacitive proximity switch and an associated evaluation process. Capacitive proximity switches of this type have sensor electrodes and should respond when a certain capacitance or capacitance change is detected between the sensor electrode and a reference electrode. For this, numerous electrodes are frequently disposed in the region of a vehicle that is configured for detecting operation.

A capacitance is formed between the sensor electrode, which is brought to a predefined potential, and a reference electrode, e.g. the vehicle ground or the ground of the surface located under the vehicle. This capacitance can change when a body moves in the sensitive region of the sensor assembly, e.g. the hand of a user, or the foot of a user. The detection of the capacitance itself can be achieved in a variety of ways. By way of example, a number of clocked discharge procedures or a discharge period can be used as the measurement value for the capacitance. Evaluation methods of this type are sufficiently known in the prior art. By way of example, a capacitive detection of a proximity to a vehicle door handle is known from DE 19617038A1.

One problem with the known sensor assemblies is that external factors lead to changes in the capacitance value of the sensor electrode, without the approach of a user. The capacitance of a sensor electrode is highly dependent on the environment, e.g. the air humidity, a coating with rain, snow, ice or dirt in the region of the sensor electrode. In this context, a capacitive proximity sensor is known, for example, from DE 19620059A1, which only switches when the capacitance between the response electrode and the reference electrode changes at a rate that is higher than a lower threshold value.

These concepts do not, however, change the fact that the evaluation circuit is normally configured to an operating point that corresponds to an expected capacitance that is to be evaluated, or to a change in the capacitance. If the capacitance is significantly changed by external factors, the precision of the evaluation also normally decreases, because the configuration of the circuit no longer corresponds to the base value of the capacitance.

The object of the invention is thus to provide an improved sensor assembly and evaluation circuit, which enables a capacitance change in an improved manner, even in environmental conditions that may change.

This object is achieved according to the invention by means of a device having the features of Claim 1.

BRIEF SUMMARY

The solution according to the invention is suited for use with any capacitive sensor system in vehicles, e.g. on door handles or for gesture recognition at the rear end of the vehicle (e.g. a kick sensor).

The fundamental mode of operation of the sensor and the associated evaluation circuit is firstly composed of coupling the sensor electrode repeatedly to a potential, or a voltage, respectively, in order to cause a charging of the sensor electrode corresponding to the capacitance. The coupling of the sensor electrode with the sensor voltage is then disengaged by a switch device, and the charged sensor electrode is coupled to the evaluation circuit. The evaluation circuit is essentially designed in the manner of a current mirror or even a simple current source circuit. The important thing is that the discharging of the sensor electrode, thus the capacitor that is to be checked, is implemented via a current path, while a charge flow, dependent thereon, is initiated in a parallel, second current path. Thus, a measurable voltage is formed in the second current path over numerous switching cycles, which is a measure for the capacitance of the sensor electrode that is to be measured.

The sensor electrode is thus coupled to a first switch device, which, through the effects of a control, causes a repeated and alternating coupling of the sensor electrode to, on one hand, a sensor operating voltage, or when switched, to the evaluation circuit. This switching can occur at a higher frequency, such that numerous cycles of the switching lead to a charge transfer in the evaluation circuit that can be evaluated. As already stated, the evaluation circuit is constructed in the manner of a current mirror or a current source circuit, at least in the substantial design features. The evaluation circuit has, accordingly, an input current path, specifically the first current path, and a second current path, dependent on the first current path. Each of the current paths contains at least one respective transistor, wherein the bases of the transistors are conductively coupled. The first current path can be coupled to the sensor electrode via the specified switch device. If therefore, the first switch device is actuated, then the sensor electrode, which was previously coupled to the sensor operating voltage and is charged according to its capacitance, is discharged via the first current path. This discharging occurs both because the first sensor electrode is coupled to the base of the first transistor in the first current branch via the coupling to the evaluation circuit, as well as because a discharge of the charge from the sensor electrode via a collector and emitter of the first transistor is enabled by the allocation of the base and the through-connection of the transistor connected thereto. Furthermore, a first auxiliary resistor R1 is disposed in this first current path.

The second current path can likewise be coupled to the sensor electrode via the base of the second transistor. A coupling of the charged sensor electrode is thus obtained to both the base of the first transistor as well as to the second transistor, and accordingly, a connection of both transistors is obtained. A reference potential (reference voltage source) is coupled to the second current path, thus in connection with the emitter and collector of the second transistor. The reference potential can have the same potential as the potential corresponding to the sensor operating voltage, but it can, however, also be at another potential (another voltage). Moreover, a second auxiliary resistor is disposed in the second current path.

The evaluation circuit according to the invention thus has a circuit design having the main features of a current mirror circuit, wherein the discharge current of a capacitance that is to be evaluated is used as the input current in the current mirror. In deviating from the classic design for a current mirror, however, an auxiliary capacitor or support capacitor is also coupled into the second current path of the output current. This capacitor enables the accumulation of a measurement value over numerous switching cycles at the sensor electrode, which can be deducted in the second current path, and serves as a measure for the capacitance change at the sensor electrode. The term "accumulation" is to be understood to mean that the supporting capacitor always experiences a change in charge when a current flow occurs through the current mirror. This change in charge is retained when the current flow stops. A new current flow is caused in the next cycle, and further charge is transferred. In observing the voltage at the support capacitor over numerous cycles, a stepped voltage course can be discerned accordingly, caused by the accumulated charge. When enough cycles have occurred, the support capacitor has a charge (and displays a voltage) that is a measure for the capacitance of the sensor electrode. The auxiliary capacitor is again discharged after the evaluation for a new series of cycles, e.g. in that a switched coupling with the ground occurs intermittently.

According to the invention, an additional capacitor, provided with switches, can be coupled into the first current path as a compensation capacitor. In this context, being able to be coupled into the system means that the capacitor can be coupled, as a rule, in parallel to the sensor electrode capacitor that is to be evaluated in the first current path, but is provided with a switch assembly, which couples the second terminal of the capacitor to either the sensor operating voltage, or creates a coupling to the ground, or leaves the capacitor without a potential (floating) at this terminal.

The substantial advantage of coupling this capacitor into the system is that it is possible to activate different measurement ranges. The switch for the compensation capacitor and the switch for coupling the sensor electrode to the evaluation circuit are typically synchronized. The compensation capacitor is applied to the senor operating voltage during the periods when no measurements are being made. A coupling of the compensation capacitor to the ground potential or the actuator having no potential occurs at the same time as the coupling of the sensor electrode and its discharge in the evaluation circuit, depending on the selected range of the measurement. Depending on the switching, the visible capacitance for the evaluation circuit, and thus the visible current flow for the evaluation circuit, are different. The coupling of the compensation capacitor thereto occurs when otherwise a removal from the optimal operating point of the evaluation circuit would exist due to environmental factors or soiling of the sensor electrode.

The effect of the invention shall be explained concretely below, with reference to an exemplary embodiment. At this point, however, the substantial steps of the concept according to the invention for the evaluation shall be described in general terms.

At the start of a measuring cycle, the first switch device is switched, in order to couple the capacitive sensor electrode to an operating voltage. The sensor electrode is thus decoupled from the evaluation circuit, because otherwise it would be charged in accordance with its capacitance and the operating voltage.

The evaluation circuit is switched at the same time, such that the auxiliary capacitor (or support capacitor) in the second current path is subjected to a voltage on one side, but the current flow through the second current path is blocked, because no current flows in the first current path, and the first and second current paths function as a current mirror.

In a second step, the first switch device is switched, by means of which the sensor electrode is decoupled from the operating voltage and is coupled to the evaluation circuit, this being the first current path of the current mirror.

If the effect of the compensation capacitor is not first taken into account, then due to the voltages present in the system, a current flow would occur from the charged sensor electrode through the first current path of the first current mirror, causing a corresponding current flow in the second current path. The support capacitor is located in the second current path, which capacitor is recharged by the current flow. In recharging the support capacitor, an accessible voltage is produced at this support capacitor.

This procedure is repeated a few times, the sensor electrode is thus decoupled from the evaluation circuit, coupled to the operating voltage, charged and re-coupled to the evaluation circuit, wherein the support capacitor accumulates an increasing charge via these cycles, and builds up voltage. After a few cycles, e.g. 5-15 cycles, the voltage of the support capacitor is evaluated and converted to a measure for the capacitance of the sensor electrode.

According to the invention, a compensation capacitor is provided in the first current path, however. This compensation capacitor is, for example, coupled in parallel to the first current path. As a result, a deviating consideration arises in the phase of the current flow as a result of the current mirror. Depending on how the compensation capacitor is switched, a portion of the discharge current flows from the sensor electrode, not through the first current path, but rather, toward the compensation capacitor. This current is lost to the current mirror, and accordingly, is not observed in the second current path, and with its portion, does not lead to a recharging of the support capacitor.

A portion of the sensor electrode charge is thus compensated for, in that it is deducted from the evaluation in the current mirror, specifically through branching off toward the compensation capacitor. Because the coupling of the second connection of the compensation capacitor with a selectable voltage, having aground or a floating potential, affects the recharging of the compensation capacitor, this is visible. Accordingly, the measure for the compensation can be adjusted via the second switch device by means of this pre-selection and coupling.

This adjustment is dependent on the detected voltage values at the support capacitor, in order to keep these rising voltage values within desired limits.

In a preferred further development of the invention, numerous compensation capacitors, e.g. two compensation capacitors, can be connected in parallel, wherein each can either be coupled separately to a ground, or connected to a floating potential. As a result, a variation of the visible current flows is obtained for the evaluation circuit in different measurement ranges, depending on the combination of the switchings of the compensation capacitors.

The current visible in the branch of the output current of the evaluation circuit is active there in the accumulation of the measurement values. Whether this current comes from the discharging of the sensor electrode capacitor or from the compensation capacitors is irrelevant in this context. Therefore, the second strand of the evaluation circuit can be adjusted to a operating range, and when the evaluated data leave the operating range, the measurement data can be returned to within the operating range by connecting the compensation capacitors.

It is apparent that the compensation capacitors can have the same capacitance values, but this is by no means necessary.

In a further development of the invention, the compensation voltage at the compensation capacitor can be varied. The compensation voltage is coupled to the first current path via the compensation capacitor. Depending on the voltage applied to the compensation capacitor terminal facing away from the current path, a charge can be transferred to the compensation capacitor when the sensor electrode is coupled thereto for evaluation. If a "voltage surplus" is built up at the compensation capacitor, then less charge flows to the capacitor, and a correspondingly greater current flow occurs through the current mirror. On the other hand, if a "voltage deficit" is generated, then more charge is discharged from the evaluation circuit toward the compensation capacitor, and less current flows through the current mirror.

BRIEF DESCRIPTION OF THE DRAWINGS

The invention shall now be explained in greater detail, based on the exemplary embodiments.

DETAILED DESCRIPTION

Figure 1:
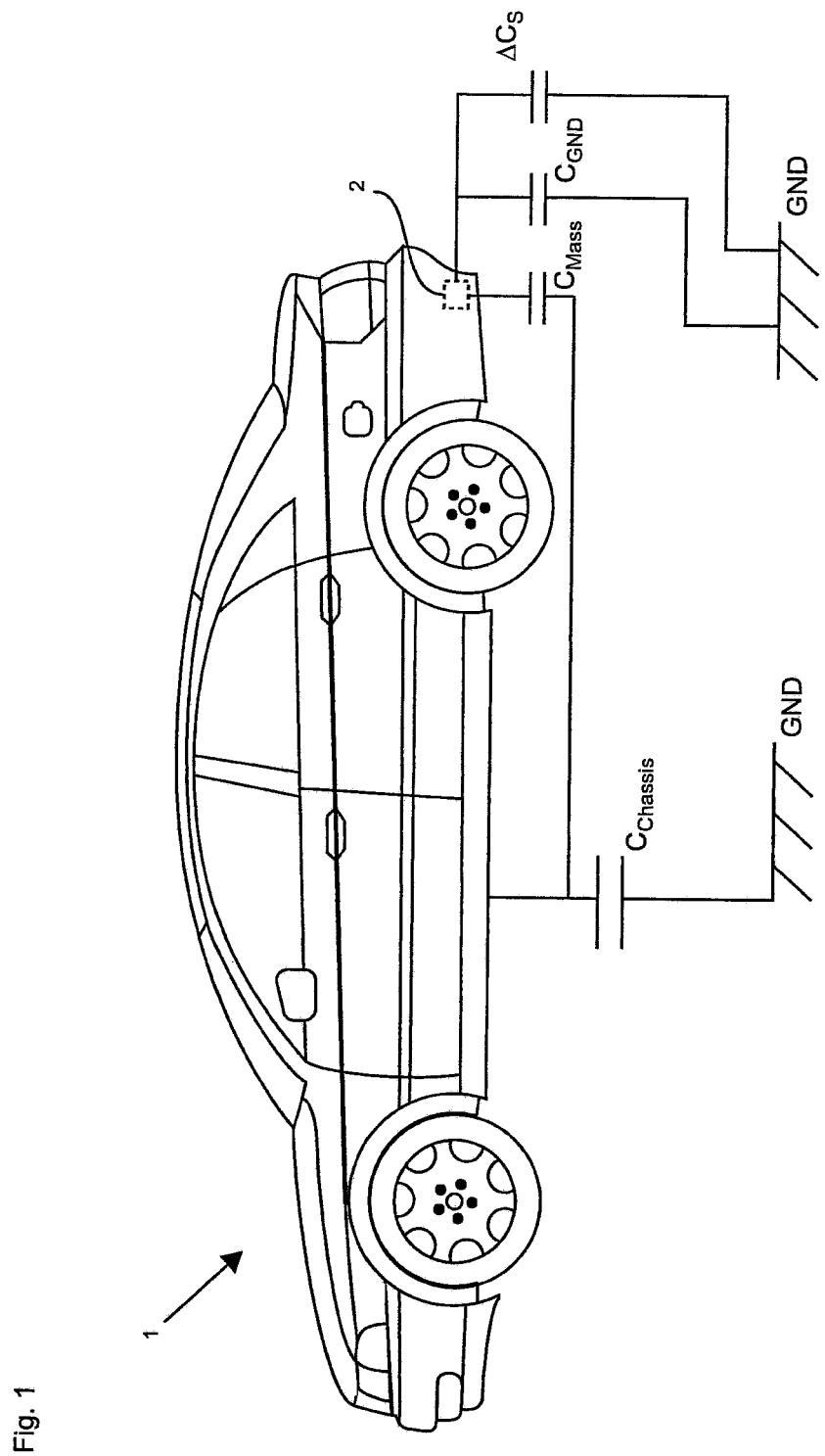
FIG. 1 shows a schematic view of the capacitors present on the vehicle.

A vehicle is depicted in FIG. 1, which has a capacitive sensor 2 in the rear. The sensor 2 is designed as a sensor electrode, disposed in the rear bumper of the vehicle. When a user wants to actuate a trunk lid, said user can execute a movement gesture, in particular move a foot under the vehicle rear, thus changing the capacitance of the sensor electrode, and thus trigger an opening of the trunk.

The electrode extends in the width of the vehicle over the entire bumper, or a specific subsection thereof, in which the user can execute the gesture.

The capacitors of the vehicle that are to be taken into account are shown schematically in the illustration. The vehicle chassis has a capacitance with respect to the actual ground potential, which is normally greater by orders of magnitude than the other capacitances. The capacitance $C_{Chassis}$ is normally multiple 100 pF, or even greater capacitances. For the following consideration, this capacitance of the vehicle chassis is normally negligible with respect to the ground potential, because the vehicle itself forms a vehicle ground, which is labeled $C_{Mass}$ in the schematic depiction, with respect to the sensor electrode.

Furthermore, the sensor electrode 2 has a capacitance with respect to the ground potential, which amounts to a few pF, e.g. approx. 5 pF. Accordingly, $C_{GND}$ equals 5 pF in this schematic view.

Moreover, a variable capacitance $\Delta C_S$ acts in parallel to $C_{GND}$. This variable capacitance is dependent on environmental conditions or the movement of a body in the surrounding region of the sensor electrode 2. There are different fundamental explanations for this effect; on one hand, the dielectric surrounding the sensor electrode 2 changes, and on the other hand, a coupling of a further capacitor (the body of the operator) in parallel to $C_{GND}$ can be drawn from as an explanation. Independently of the explanation, however, the capacitance $\Delta C_S$ is that capacitance that is to be detected for the recognition of an actuation. The capacitance $\Delta C_S$, thus the change in capacitance through external factors or actuation, is significantly lower than the capacitance $C_{GND}$ thereby. Normally, the capacitance $\Delta C_S$ is less than one pF, e.g. less than 0.5 pF.

The capacitance $C_{GND}$ is altered by environmental effects, e.g. drying salt water, grease layers, or even lacquer applications on the bumper. When the capacitance $C_{GND}$ is increased, the actual detection capacitance $\Delta C_S$ is more difficult to detect. The field lines of the electric field, which are generated by the sensor electrode 2, are strongly influenced by disturbances of this type, in particular conductive layers, and no longer sufficiently extend into the detection range.

For this reason, it is important to detect small capacitance changes, even when the base capacitance that is present at all times is variable.

The invention is applied thereby, in that a displacement of the operating point for the circuit is possible depending on the detected measurement values.

Figure 2:
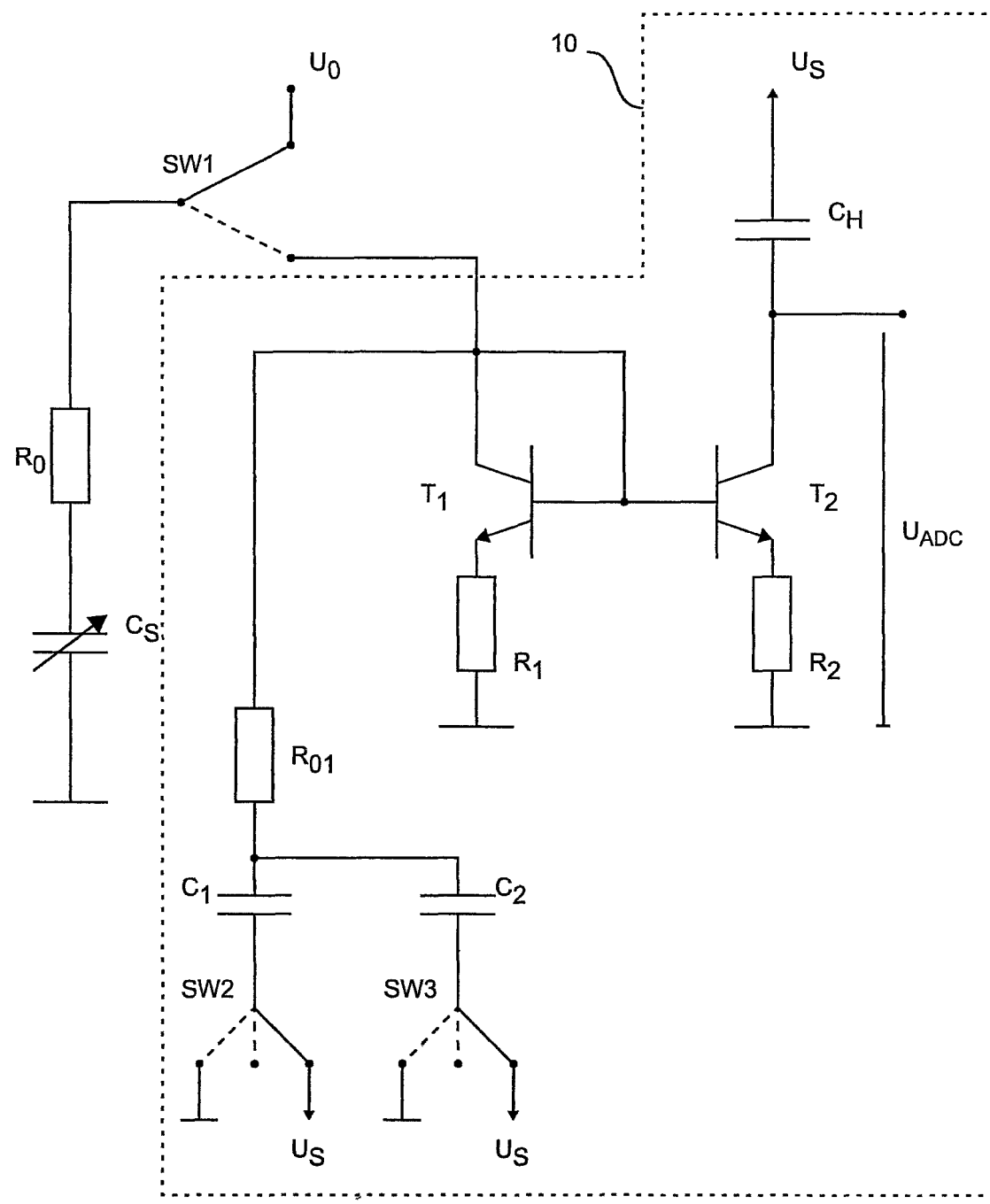
FIG. 2 shows a first exemplary embodiment of the invention in the form of a reduced block diagram.

FIG. 2 shows a corresponding schematic circuitry. It can be seen that the circuitry is borrowed, in sections, from a simple current source circuit or even a current mirror.

The variable capacitance $C_S$ of the sensor electrode that is to be detected is depicted in the diagram as a variable capacitor. This capacitor is coupled, by way of example, with a damping resistor R0, and with a first switch device SW1. The switch device SW1 can be activated electronically, and can couple the sensor electrode, thus the capacitance $C_S$, to an operating voltage $U_0$. In another switching setting, this coupling is released by means of the switch device SW1, and the sensor electrode is coupled to the evaluation circuit for evaluation.

As is shown in the illustration, when the sensor electrode having a capacitor $C_S$ is coupled to the evaluation circuit 10, the discharging of the sensor electrode represents the input current side of the current mirror. For this reason, a collector terminal and a base terminal are connected to the transistor T1 and can be coupled to the sensor electrode. If an input current flows through the transistor T1, then a base-emitter voltage is set, which is linked to the input current.

The base terminals for the two transistors T1 and T2 are connected. In the second current path of the evaluation circuit, formed by the "sample and hold" or support capacitor $C_H$, the transistor T2 and the auxiliary resistor $R_2$ are likewise coupled to the supply voltage $U_S$. A voltage $U_{ADC}$ can be accessed. This voltage serves as a measure for the capacitance $C_S$ after accumulation of a charge on the capacitor $C_H$ over numerous measurement cycles.

The invention has, however, compensation capacitors parallel to the first current path of the current mirror. In this exemplary embodiment, two further switch devices SW2 and SW3 are coupled to associated compensation capacitors $C_1$ and $C_2$. Depending on the switch settings of the switches SW2 and SW3, the capacitors can be connected to either a ground potential or a floating potential at their terminals, located at the bottom of the capacitors in the depiction. In the phases in which the switch SW1 and the sensor electrode are coupled to the operating voltage $U_0$, the capacitors C1 and C2 can be coupled to the supply voltage $U_S$.

In order to evaluate the capacitance $C_S$, the switch SW1 is actuated for a number of switchings, such that the capacitance $C_S$ is always recharged, and is discharged via the evaluation circuit.

The steps thereby are as follows:

coupling the capacitor $C_S$ to the operating voltage $U_0$ by means of a switch device SW1, by means of which $C_S$ is charged in accordance with the capacitance of the sensor electrode;

decoupling the capacitor $C_S$ from the operating voltage $U_0$ by means of the switch device SW1, by means of which $C_S$ maintains the existing charge;

coupling the capacitor $C_S$ to the evaluation circuit 10, wherein a charge compensation occurs between $C_S$ and the capacitors $C_1$ and $C_2$, wherein the charge flow is dependent on the charge states of $C_1$ and $C_2$, as well as the potentials coupled thereto via SW2 and SW3 (the switches SW1 and SW2 or SW3, respectively, are switched at the same time);

the charge portion that has not be compensated for, thus the charge portion from CS that does not flow toward C1 and C2, is conducted through the first, left-hand path of the current mirror, and generates a corresponding current in the second, right-hand path;

the current flow generated in the right-hand path results in a charge change at $C_H$, which is correlated to the uncompensated charge quantity from $C_S$;

SW1 is again actuated for charging CS, and the process starts again, wherein a charge is accumulated at $C_H$, which can be called up in the design of the voltage $U_{ADC}$;

the steps are repeated eight to ten times, and the voltage $U_{ADC}$ is then A/D converted and interpreted as a representative value for the charge at $C_H$;

$C_H$ is discharged from the accumulated charge, and a new measurement cycle is begun.

The voltage $U_{ADC}$ that is obtained is dependent on the number of switchings as well as the supply voltage $U_S$ and the relationship between the capacitors $C_S$ and $C_H$, as well as the relationships between the resistors R1 and R2. The quantitative relationships can be adapted to the respective application by means of simple circuit simulations and the expert knowledge regarding current mirrors.

If it has been detected, based on the determined values, that the detected voltage value $U_{ADC}$ does not move in the configuration range of the circuit, thus a variable capacitance can only be insufficiently precisely determined, the switches SW2 and SW3 can be set to various ranges and combinations, such that either both capacitors C1 and C2 are kept at floating potentials, one of the capacitors is coupled to the ground potential, or both capacitors are coupled to the ground potential.

Based on the diagram, it is immediately apparent that the connecting of the capacitors C1 and C2 in addition to the capacitor $C_S$ affects the evaluation circuit, in that the capacitance that is to be detected is again displaced to the configuration region.

In this manner, sensitive detections are possible, even in adverse environmental conditions, in particular in the event of a coating of the sensor electrode with, e.g., salt crusts or dirt. It is thus essential that the compensation range can be adjusted in situ, depending on which measurement range displacement is required.

In a further development of the invention, larger numbers of compensation capacitors can also be incorporated.

Figure 3:
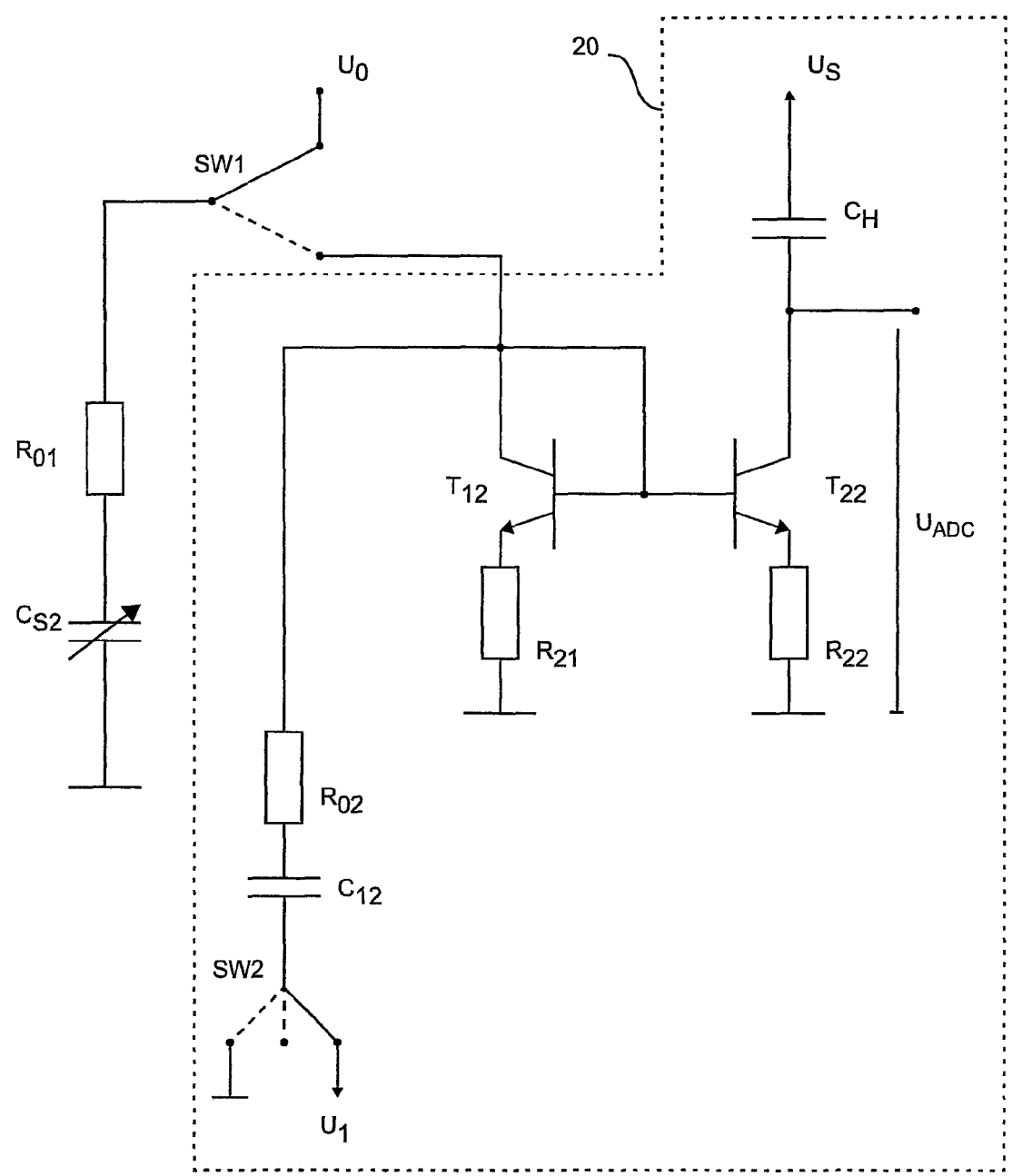
FIG. 3 shows a second exemplary embodiment of the invention in the form of a reduced block diagram.

An alternative design of the invention is depicted in FIG. 3. A charge compensation is obtained here in that a compensation capacitor having a fixed capacitance $C_{12}$ is used. This capacitor, however, can be coupled to an adjustable voltage $U_1$, the compensation voltage. Accordingly, with this embodiment, the charge compensation is achieved via the variable compensation voltage $U_1$, and not via the change in the capacitor capacitances. The compensation voltage $U_1$ is preferably defined as $U_1 \leq U_0$ thereby. The voltage causes a variable voltage deficit or voltage surplus at the compensation capacitor. Depending on the voltage that is set, the coupled compensation capacitor can thus accommodate different charge quantities, which are branched off prior to the current mirror thereby, and do not result in a charging of the support capacitor.

In the scope of the invention, a combination of the compensation methods presented herein can also be implemented, such that numerous capacitors can thus be connected thereto, of which one or more are coupled to adjustable voltage sources. As a result, a particularly precise compensation adjustment is made possible. The adjustable voltage sources are controlled thereby according to known methods, in order to adjust the charge quantities to the compensation capacitors, such that the sensitivity of the measurement circuit is restored to the desired measurement range.

In the scope of the invention, deviations, in particular regarding the number of sensed capacitors and compensation capacitors, are possible. Instead of the depicted individual sensed capacitor ($C_S$) in the exemplary embodiments, numerous sensor electrodes, or sensor capacitors, respectively, having allocated switch devices, can be coupled to the same evaluation circuit. Furthermore, the part of the circuit that is designed as a current mirror circuit can also be varied within the scope of the known design alternatives for current mirror circuits.

The invention claimed is:

1. A method for detecting a capacitance of a sensor electrode, comprising the steps:

charging a sensor electrode by coupling the sensor electrode to an operating voltage, decoupling the sensor electrode from the operating voltage and coupling the sensor electrode to a compensation capacitor, in order to bring about a charge compensation between the compensation capacitor and the sensor electrode, wherein the compensation capacitor is formed by one or more capacitors, and is adapted to be selectively coupled, via a switch device, to a compensation voltage, a ground, or in a floating manner, in relation to the sensor electrode, discharging a remaining charge of the sensor electrode via a first current path of a current mirror, wherein a corresponding current is generated in a second current path of the current mirror, and wherein a support capacitor is coupled to the second current path and is recharged by means of the generated current, wherein the preceding steps are repeated and a charge state of the support capacitor is evaluated as a measure of the capacitance of the sensor electrode wherein the compensation voltage is variable and is defined, dependent on the determined charge state of the support capacitor; and wherein the coupling of the individual capacitors to the sensor electrode is carried out depending on the determined charge state of the support capacitor.

* * * * *